United States Patent
Kim et al.

(10) Patent No.: US 6,258,508 B1
(45) Date of Patent: Jul. 10, 2001

(54) POLYMER USING NORBORNENE MONOMERS WITH DERIVATIVES OF CHOLIC ACID, DEOXYCHOLIC ACID OR LITHOCHOLIC ACID AND USE THEREOF

(75) Inventors: Jin Baek Kim, Seoul; Bum Wook Lee, Euwang, both of (KR)

(73) Assignee: Korea Advanced Institute of Science and Technology, Taejeon (KR)

( * ) Notice: Subject to any disclaimer, the term of this patent is extended or adjusted under 35 U.S.C. 154(b) by 0 days.

(21) Appl. No.: 09/514,220

(22) Filed: Feb. 25, 2000

(30) Foreign Application Priority Data

Mar. 3, 1999 (KR) .................................................. 99-6989

(51) Int. Cl.$^7$ .......................... G03F 7/004; C07C 69/74; C07C 61/12; C08F 10/00
(52) U.S. Cl. ....................... 430/270.1; 560/116; 562/498; 526/271; 526/272; 526/281
(58) Field of Search .................. 430/270.1; 560/116; 562/498; 526/271, 281, 272

(56) References Cited

U.S. PATENT DOCUMENTS

| | | | |
|---|---|---|---|
| 3,666,473 | 5/1972 | Colom et al. | 96/91 D |
| 4,115,128 | 9/1978 | Kita | 96/91 D |
| 4,173,470 | 11/1979 | Fahrenholtz et al. | 430/5 |
| 4,311,782 | 1/1982 | Buhr et al. | 430/270 |
| 4,405,708 | 9/1983 | van Pelt et al. | 430/281 |
| 4,491,628 | 1/1985 | Ito et al. | 430/176 |
| 6,132,936 | * 10/2000 | Jung | 430/270.1 |
| 6,180,316 | * 1/2001 | Kajita et al. | 430/270.1 |

FOREIGN PATENT DOCUMENTS

989458 * 3/2000 (EP) .

OTHER PUBLICATIONS

CA 1995:308980, DN 122:214321.*
CA 1994:134919, DN 120:134919.*

* cited by examiner

*Primary Examiner*—Rosemary E. Ashton
(74) *Attorney, Agent, or Firm*—Jenkens & Gilchrist, A Professional Corporation

(57) ABSTRACT

The present invention relates to a polymer prepared by synthesizing monomer having a derivative of cholic acid, deoxycholic acid or lithocholic acid bonded to norbornene, and then homopolymerizing these monomer, copolymerizing these monomer with maleic anhydride, or copolymerizing these monomer, maleic anhydride and 2-hydroxyethyl 5-norbornene-2-carboxylate and/or 5-norbornene-2carboxylic acid, and its use as a photoresist. The polymer synthesized according to the present invention is dissolved in a solvent, together with a photo-acid generator, and filtered through a filter to make a photoresist solution which can be used to produce a lithographic image on a silicon wafer.

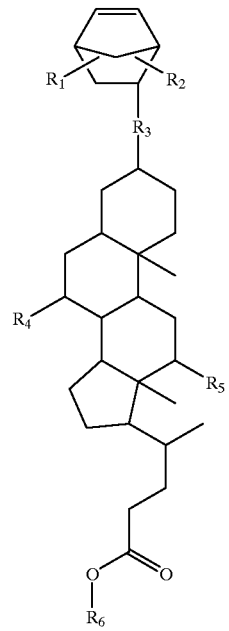

7 Claims, No Drawings

POLYMER USING NORBORNENE MONOMERS WITH DERIVATIVES OF CHOLIC ACID, DEOXYCHOLIC ACID OR LITHOCHOLIC ACID AND USE THEREOF

BACKGROUND OF THE INVENTION

1. Field of the Invention

The present invention relates to a polymer prepared by synthesizing a monomer having a derivative of cholic acid, deoxycholic acid or lithocholic acid bonded to norbornene, and then homopolymerizing the monomer, copolymerizing the monomer with maleic anhydride, or copolymerizing the monomer, maleic anhydride and 2-hydroxyethyl 5-norbornene-2-carboxylate and/or 5-norbornene-2-carboxylic acid, and its use as a photoresist.

2. Description of the Prior Art

As reported in U.S. Pat. Nos. 3,666,473, 4,115,128, and 4,173,470, the conventional photoresist is generally formed of a composition containing an alkali-soluble phenol- (or cresol)formaldehyde novolak resin and a substituted naphthoquinone diazide compound as a photosensitive substance. However, an integrated circuit increasingly has an enhanced integration degree, and a wavelength of the exposing machine used in a photographic lithography is, therefore, in the range of 200 nm to 300 nm which is a far ultraviolet region. A this far ultraviolet region, the photoresist containing the naphthoquinone as the photosensitive substance is too strong in light absorption, and low in sensitivity, such that it is difficult to use. As a result, it is necessary to develop a new photoresist capable of effectively being used at this far ultraviolet region.

The development of the new photoresist must be made such that various requirements for characteristics of the photoresist are satisfied, such as a high sensitivity, a contrast, a high resolution, and a dry etch resistance. Among these characteristics, the sensitivity is most important, and to increase the sensitivity, a concept of a chemical amplification was introduced. In this chemical amplification, activated species generated by a photochemical reaction serve as a catalyst, such that chemical reactions, such as a deprotection, and a cross-linking, can successively occur, whereby a total quantum yield of these reactions is high as compared with that of the initial catalyst production reaction.

Consequently, in order to attain the high sensitivity in a lithographic process for fabricating a semiconductor device, there are recently highly spotlighted chemical amplification type photoresists. Among them, polybisphenol protected with t-butoxycarbonyl group is reported as a resin with a greatest possibility, as described in U.S. Pat. Nos. 4,311,782, 4,405,708, and 4,491,628.

A study on a photoresist required for the development of a semiconductor chip of 1 G(giga) bit or more DRAM is actively progressive, now. Where an argon fluoride(ArF) excimer laser having a wavelength of 193 nm is used as an exposure source, polyvinylphenols according to the prior art can not be used, since they show a strong light absorption and a low sensitivity, due to aromatic rings included therein. As a result, the chemical amplification type photoresist with an alicyclic compound was proposed for the production of a photoresist fairly resistant to dry etch and transparent to argon fluoride excimer laser light of 193 nm wavelength. As for this photoresist, there was reported a structure, in which an aliphatic compound was bonded to a branched chain of an acrylic compound, or another structure, in which an aliphatic compound, as a dissolution inhibitor, is added to a polymer, as disclosed in U.S. Pat. Nos. 5,585,223, 5,691,111, and 5,756,850.

SUMMARY OF THE INVENTION

It is therefore an object of the present invention to prepare a polymer by synthesizing a monomer, in which a derivative of cholic acid, deoxycholic acid or lithocholic acid having a polycyclic aliphatic structure, and fairly resistant to dry etching and transparent to argon fluoride excimer laser having a wavelength of 193 nm, is bonded to norbornene, and then homopolymerizing the monomer, copolymerizing the monomer and maleic anhydride, or copolymerizing the monomer, maleic anhydride, and 2-hydroxyethyl 5-norbornene-2-carboxylate and/or 5-norbornene-2-carboxylic acid.

It is another object of the present invention to use the prepared polymer as a chemical amplification type photoresist.

DETAILED DESCRIPTION OF THE PREFERRED EMBODIMENTS

The foregoing and other objects, features and advantages of the invention will be apparent to those skilled in the art to which the present invention relates from reading the following specification.

The present invention is to prepare a monomer, in which a derivative of cholic acid, deoxycholic acid, or lithocholic acid, which is a substance belonging in a steroid system, is bonded to norbornene, and to prepare a polymer by homopolymerizing the monomer, copolymerizing the monomer and maleic anhydride, or copolymerizing the monomer, maleic anhydride, and 2-hydroxyethyl 5-norbornene-2-carboxylate and/or 5-norbornene-2-carboxylic acid, and also to use the polymer as a chemical amplification type photoresist.

The monomer having a derivative of cholic acid, deoxycholic acid, or lithocholic acid belonging in a steroid system, which derivative is bonded to norbornene, is synthesized by the following two reaction steps. The first step is a reaction to synthesize a derivative of cholic acid, deoxycholic acid or lithocholic acid. With the first reaction, an acid group of cholic acid, deoxycholic acid or lithocholic acid is converted into a protecting group which is left by an acid. Such a first reaction is carried out at alternative temperatures of 0° C. and room temperature, under atmospheric pressure for about 24 hours. Thereafter, the second reaction is to react the protecting group-formed derivative of cholic acid, deoxycholic acid or lithocholic acid, with norbornene derivative such as 2-chloro-carbonyl-5-norbornene, at a temperature of 0° C. under atmospheric pressure for one to two hours, and then at room temperature under atmospheric pressure for five to six hours, thereby to give a compound in which a derivative of cholic acid, deoxycholic acid or lithocholic acid is bonded to norbornene. Alternatively, the protecting group-formed derivative of cholic acid, deoxycholic acid or lithocholic acid may also react with an acryloylchloride vinyl derivative at a temperature of 0° C. under atmospheric pressure for one to two hours, and then at room temperature under atmospheric pressure for five to six hours, and the resulting product is subjected to a Diels-Alder reaction, thereby to give a compound in which the derivative of cholic acid, deoxycholic acid or lithocholic acid is bonded to norbornene.

The produced monomer, in which the derivative of cholic acid, deoxycholic acid or lithocholic acid is bonded to norbornene, is homopolymerized using a radical polymerization, copolymerized with maleic anhydride using a radical polymerization, or copolymerized with maleic anhydride and 2-hydroxyethyl 5-norbornene-2-carboxylate and/or 5-norbornene-2-carboxylic acid using a radical polymerization. Examples of radical polymerization initiators useful for the radical polymerization include benzoyl peroxide, 2,2'-azobisisobutyronitrile, acetyl peroxide, lauryl peroxide, and di-t-butyl peroxide. Moreover, examples of solvents useful for the radical polymerization include benzene, toluene, tetrahydrofuran, and a combination of two or more of these solvents. The polymerization is carried out in a sealed glass tube ampule at 50 to 70° C. for 6 to 30 hours.

The monomer, in which the derivative of cholic acid, deoxycholic acid, or lithocholic acid is bonded to norbornene, has the following formula I:

(I)

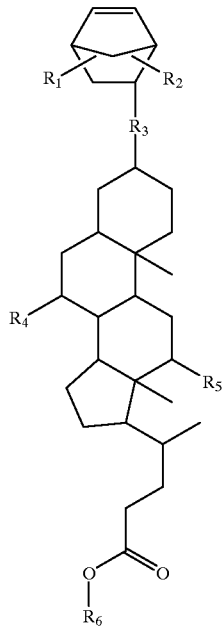

where $R_1$ and $R_2$ each represent H, $CH_3$, OH, $CH_2OH$, $CO_2CH_3$, or $CO_2C(CH_3)_3$ with which norbornene is substituted, $R_3$ represents $(CH_2)_nO$ (n=0 to 3), $CO(CH_2)_nO$ (n=0 to 3), or $COO(CH_2)_nO$ (n=0 to 3), $R_4$ and $R_5$ each represent H, OH, $OCOCH_3$, OCO $(CH_2O)_nCH_3$ (n=1 to 10), $OCO(CH_2CH_2O)_nCH_3$ (n=1 to 7), or $OCOO(CH_2,CH_2O)_n$ $CH_3$ (n=1 to 7), $R_6$ represents H, C $(CH_3)_3$, CH $(CH_3)O$ $(CH_2)_nCH_3$ (n=1 to 3), or a tetrahydropyranyl protecting group.

Meanwhile, the polymer prepared by homopolymerizing the monomer, in which the derivative of cholic acid, deoxycholic acid or lithocholic acid is bonded to norbornene, can be represented by the following formula XIV:

(XIV)

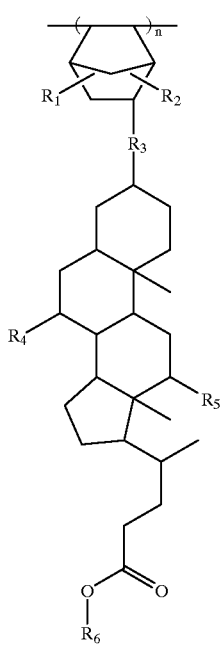

where $R_1$, $R_2$, $R_3$, $R_4$, $R_5$, and $R_6$ have the same meaning as defined above for the formula I, and n represents a polymerization degree ranging from 1 to 100.

Moreover, the polymer prepared by copolymerizing the monomer, in which the derivative of cholic acid, deoxycholic acid or lithocholic acid is bonded to norbornene, with maleic anhydride, can be represented by the following formula II:

(II)

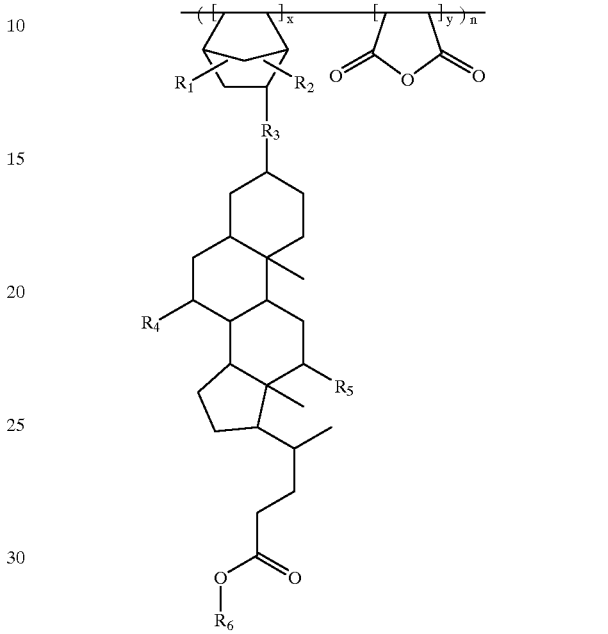

where $R_1$, $R_2$, $R_3$, $R_4$, $R_5$, $R_6$, and n have the same meaning as defined above for the formula XIX, and x=y=0.5.

Furthermore, the polymer prepared by copolymerizing the monomer, in which the derivative of cholic acid, deoxycholic acid or lithocholic acid is bonded to norbornene, with maleic anhydride and 2-hydroxyethyl 5-norbornene-2-carboxylate, can be represented by the following formula III:

(III)

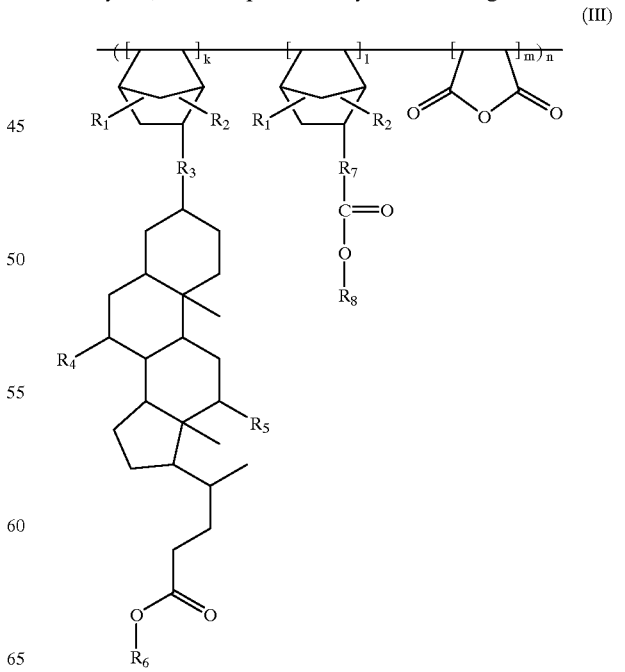

where $R_1$, $R_2$, $R_3$, $R_4$, $R_5$, $R_6$, and n have the same meaning as defined above for the formula XIX, $R_7$ represents $(CH_2)_n$ (n=0 to 3), $CO(CH_2)_n$ (n=0 to 3), or $COO(CH_2)_n$ (n=1 to 3), $R_8$ represents H, $C(CH_3)$, or $CH(CH_3)O(CH_2)_n CHd_n$ (n=1 to 3), a tetrahydropyranyl group, $(CH_2)_n$ (n=1 to 3)OH, or $(CH_2)_n$(n=0 to 3)$OCO(CH_2)_n$(n=1 to 3), and k+l=m=0.5.

In addition, the polymer prepared by copolymerizing the monomer, in which the derivative of cholic acid, deoxycholic acid or lithocholic acid is bonded to norbornene, with maleic anhydride, 2-hydroxyethyl 5-norbornene-2-carboxylate and 5-norbornene-2-carboxylic acid, can be represented by the following formula IV:

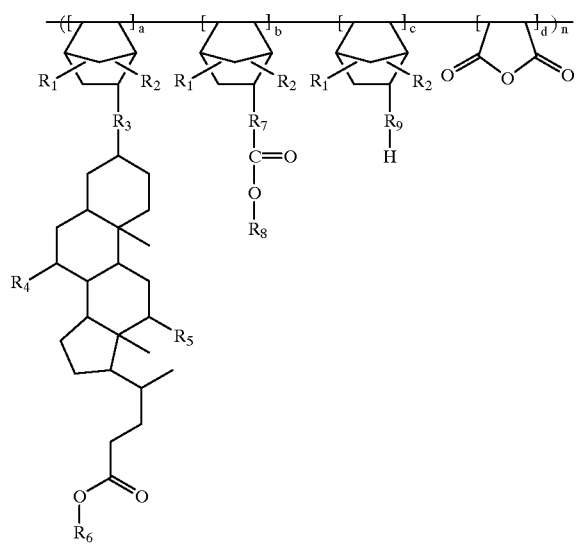

(IV)

where $R_1$, $R_2$, $R_3$, $R_4$, $R_5$, $R_6$, $R_7$, $R_8$, and n have the same meaning as defined above for the formula IV, $R_9$ represents $(CH_2)_n O$(n=0 to 3), $CO(CH_2)_n O$(n=0 to 3) or $COO(CH_2)_n O$(n=1 to 3), and a+b+c=d=0.5.

Meanwhile, the polymer, which can be represented by the formula II, III, IV, or XIV, is dissolved in a solvent such as propyleneglycolmonomethylether acetate or cyclohexanone, together with triphenylsulfonium triflate or other onium salt, as a photo-acid generator. The resulting solution is filtered through a filter to give a photoresist solution. The photoresist solution is spin-coated on a silicon wafer, and then is subjected to a prebaking on a hot plate at a temperature 90 to 120° C. for 90 to 120 seconds. Thereafter, the photoresist coating is exposed to a pattern of light on a stepper, and then is subjected to a postbaking on a hot plate at a temperature of 90 to 140° C. for 90 to 120 seconds. The postbaked photoresist is developed with a developing solution such as aqueous tetramethylammoniumhydroxide solution, aqueous potassium hydroxide solution, aqueous sodium hydroxide solution, aqueous calcium carbonate solution, aqueous potassium carbonate solution, aqueous sodium phosphate solution, aqueous sodium silicate solution, aqueous ammonia, aqueous amine solution, or a combination of two or more of these developing solutions, to obtain a photoresist image.

The present invention will be further described with reference to the following examples and application examples. Note, however, that the examples are included herein for only explanation purpose and they are not restrictive of the present invention.

EXAMPLE 1
Preparation of t-butylcholic acid

A 500 ml three-necked, round-bottomed flask was charged with 10.0 g (0.025 mole) of cholic acid which was then dissolved in 200 ml of purified tetrahydrofuran. Then, one neck centrally disposed in the flask was connected to a condenser to which a tube containing aqueous calcium chloride was connected. One neck disposed at the right of the flask was connected to a tube through which nitrogen gas could be introduced into the flask, while the remaining one neck disposed at the left of the flask was connected with a dropping funnel. Then, the connections were well sealed with a Teflon tape. Next, nitrogen gas was introduced into the flask so that the inside of the reactor was under a nitrogen atmosphere. In this state, the flask was maintained at a temperature of 0° C. with ice water, and the dropping funnel was then charged with 30 ml (0.14 mole) of anhydrous trifluoroacetic acid which was then slowly dropped into the flask. The resulting mixture was stirred at room temperature for 90 minutes. After this, the flask was cooled down to a temperature of 0° C., again, and 60 ml of t-butyl alcohol was then slowly dropped through the dropping funnel. After this dropping, the temperature of the flask was elevated to room temperature, and the contents of the flask were then stirred for 6 hours. Thereafter, 40 ml (28% w/w) of aqueous ammonia was added dropwise at a temperature of 0° C., and the resulting mixture was stirred for 12 hours. Then, 20 ml (28% w/w) of aqueous ammonia was additionally added dropwise to the flask at a temperature of 0° C., and the flask was then elevated in temperature to room temperature. After stirring the resulting mixture at room temperature for 6 hours, the reaction was terminated.

The solution produced from the reaction was subjected to an extraction with 400 ml of ethyl ether and 200 ml of water to extract an organic layer. The organic layer was washed with 200 ml of 1 mole sodium hydroxide aqueous solution, and then washed with 200 ml of water twice. The washed organic layer was added with 10 g of aqueous magnesium sulfate, and then stirred at room temperature for 12 hours to remove the remaining water. The resulting material was filtered on a glass filter to remove anhydrous magnesium sulfate from the organic layer. The resulting organic layer was concentrated with an evaporator, and the concentrated solution was dissolved in 200 ml of acetonitrile at a temperature of 50° C. and then left to stand at −20° C. for 24 hours to be crystallized. The crystal was filtered with a glass filter to remove acetonitrile. Subsequently, the resulting material was dried under vacuum at a temperature of 40° C. for 12 hours, thereby to obtain 9.2 g (81% yield) of t-butyl cholic acid, as a pure white solid, represented by the following formula V.

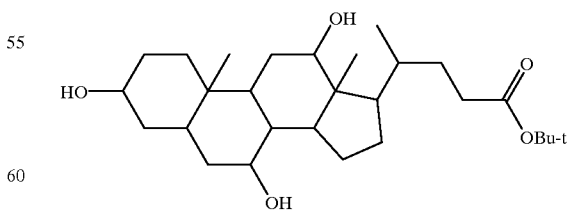

(V)

EXAMPLE 2
Preparation of t-butyldeoxycholic acid

After a 500 ml three-necked, round-bottomed flask was charged with 10.0 g (0.026 mole) of deoxycholic acid, the flask was equipped with the same equipment as that in Example 1. Nitrogen gas was introduced into the flask so that the inside of the flask was under a nitrogen atmosphere. In this state, the flask was maintained at a temperature of 0° C. with ice water, a dropping funnel was charged with 20 ml (0.09 mole) of anhydrous trifluoroacetic acid which was then slowly dropped into the inside of the flask. After this, the temperature of the flask was elevated to room temperature, and the contents of the flask were stirred for 90 minutes. Next, the flask was then cooled down to a temperature of 0° C., and 60 ml of t-butyl alcohol was then slowly dropped into the inside of the flask. Thereafter, the flask was elevated to room temperature, and the contents of the flask were then stirred for 6 hours.

After that, 30 ml (28% w/w) of aqueous ammonia was dropped at a temperature of 0° C., and a stirring was then carried out at this temperature for 12 hours. After this stirring, 15 ml (28% w/w) of aqueous ammonia was additionally dropped at a temperature of 0° C. After the resulting mixture was then stirred at room temperature for 6 hours, the reaction was terminated.

Then, a solution produced from the reaction was treated in the same manner as that in Example 1, thereby removing anhydrous magnesium sulfate from an organic layer. After the resulting organic layer was concentrated by an evaporator at a temperature of 25° C. or below, the concentrated material was dried under vacuum at this temperature for 12 hours, thereby obtaining 8.4 g (74% yield) of t-butyldeoxycholic acid, as a pure white solid, represented by the following formula VI.

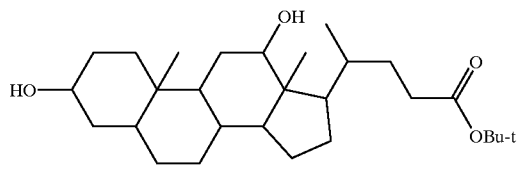

(VI)

EXAMPLE 3
Preparation of t-butyllithocholic acid

After a 500 ml three-necked, round-bottomed flask was charged with 10.0 g (0.027 mole) of lithocholic acid which was then 200 ml of purified tetrahydrofuran. Next, the flask was equipped with the same equipment as that in Example 1. Nitrogen gas was introduced into the flask so that the inside of the flask was under a nitrogen atmosphere. In this state, the flask was maintained at a temperature of 0° C. with ice water, a dropping funnel was charged with 15 ml (0.07 mole) of anhydride trifluoroacetic acid which was then slowly dropped into the inside of the flask. After this, the temperature of the flask was elevated to room temperature, and the contents of the flask were then stirred for 90 minutes. Next, the flask was cooled down to a temperature of 0° C., and 60 ml of t-butyl alcohol was then slowly dropped through a dropping funnel into the inside of the flask. Thereafter, the flask was elevated to room temperature, and the material in the flask was then stirred at this temperature for 6 hours. After that, 20 ml (28% w/w) of aqueous ammonia was dropped at a temperature of 0° C., and a stirring was then carried out at this temperature for 12 hours. After this stirring, the reaction was terminated.

Then, a solution produced from the reaction was treated in the same manner as that in Example 1, thereby removing anhydrous magnesium sulfate from an organic layer. After the resulting organic layer was concentrated by an evaporator, the concentrated material was dissolved in 200 ml of n-hexane and then left to stand at a temperature of −20° C. for 24 hours to be crystallized. The crystal was filtered on a glass filter to remove n-hexane, and then dried under vacuum at a temperature of 40° C. for 12 hours, thereby obtaining 9.6 g (84% yield) of t-butyllithocholic acid, as a pure white solid, represented by the following formula VII.

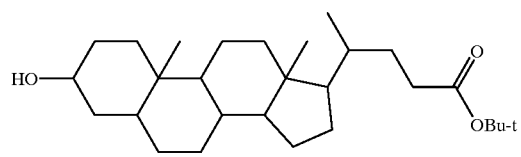

(VII)

EXAMPLE 4
Preparation of t-butyl 3α-(5-norbornene-2-carbonyloxy) -7α, 12α-dihydroxy-5β-cholan-24-oate A 500 ml three-necked, round-bottomed flask was charged with 10.0 g (0.022 mole) of t-butylcholic acid prepared in Example 1, which was then dissolved in 200 ml of purified ethyl ether. Afterwards, the flask was charged with 3 ml (0.021 mole), then equipped with the same equipment as that in Example 1. Nitrogen gas was introduced into the flask so that the inside of the flask was under a nitrogen atmosphere. In this state, the flask was maintained at a temperature of 0° C. with ice water. Next, a dilution of 3.3 g (0.021 mole) of 2-chlorocarbonyl-5-norbornene, prepared by a Diels-Alder reaction of cyclopentadiene and acryloylchloride, in 50 ml of purified ethyl ether, was slowly dropped through a dropping funnel into the inside of the flask. After this, the temperature of the flask was elevated to room temperature, and the contents of the flask were stirred for 6 hours, before the reaction was terminated.

Then, a salt produced from the reaction was filtered on a glass filter, and the filtered solution was subjected to an extraction with 200 ml of ethyl ether and 200 ml of water to extract an organic layer. The extracted organic layer was concentrated by an evaporator, and then dissolved in a mixed solution in n-hexane/ethyl acetate (3/1, volume ratio). After the resulting solution was purified by a column chromatography with a developing solution of n-hexane/ethyl acetate (5/1, volume ratio), it was concentrated with an evaporator, and then dried under vacuum at a temperature of 40° C. for 12 hours, thereby obtaining 5.6 g (45% yield) of t-butyl 3α-(5-norbornene-2-carbonyloxy) -7α, 12α-dihydroxy-5β-cholan-24-oate, as a pure white solid, represented by the following formula VIII.

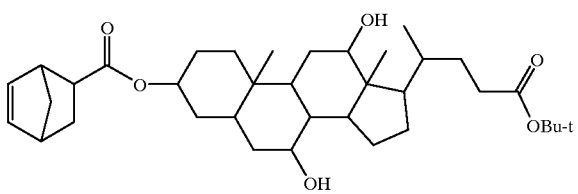

(VIII)

EXAMPLE 5
Preparation of t-butyl 3α-(5-norbornene-2-carbonyloxy)-7α-hydroxy-5β-deoxycholan-24-oate A 500 ml three-necked, round-bottomed flask was charged with 10.0 g (0.022 mole) of t-butyldeoxycholic acid prepared in Example 2 and 3 ml (0.021 mole) of triethylamine. After the mixture was dissolved in 200 ml of purified ethyl ether, the flask was equipped with the same equipment as that in Example 1. After that, the same procedures as those in Example 4 were carried out, thereby obtaining 6.3 g (50% yield) of t-butyl 3α-(5-norbornene-2-carbonyloxy)-7α-hydroxy-5β-deoxycholan-24-oate, as a pure white solid, represented by the following formula IX.

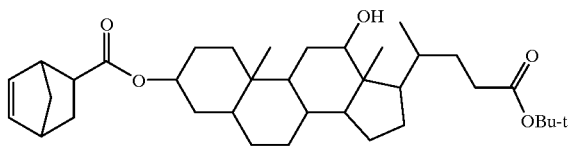

(IX)

EXAMPLE 6
Preparation of t-butyl 3α-(5-norbornene-2-carbonyloxy)-5β-lithocholan-24-oate A 500 ml three-necked, round-bottomed flask was charged with 10.0 g (0.023 mole) of t-butyllithcholic acid prepared in Example 3 and 3 ml (0.021 mole) of triethylamine. After the mixture was dissolved in 200 ml of purified ethyl ether, the flask was equipped with the same equipment as that in Example 1. After that, the same procedures as those in Example 4, except that the developing solution in the column chromatography was n-hexane/ethyl acetate (3/1, volume ratio), were carried out, thereby obtaining 7.8 g (61% yield) of t-butyl 3α-(5-norbornene-2-carbonyloxy) -5β-lithocholan-24-oate, as a white solid, represented by the following formula X.

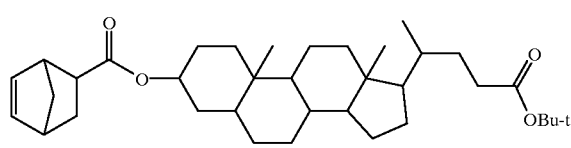

(X)

EXAMPLE 7
Preparation of t-butyl 3α-(5-norbornene-2-methoxy) -7α, 12α-dihydroxy-5β-cholan-24-oate A 500 ml three-necked, round-bottomed flask was charged with 10.0 g (0.022 mole) of t-butylcholic acid prepared in Example 1, which is then dissolved in 100 ml of purified tetrahydrofuran. Then, one neck centrally disposed in the flask was connected to a condenser to which a tube containing aqueous calcium chloride was connected. One neck disposed at the right of the flask was connected to a tube through which nitrogen gas could be introduced into the flask, while the remaining one neck disposed at the left of the flask was stopped with a rubber stopper. Then, the connections were well sealed with a Teflon tape. Next, nitrogen gas was introduced into the flask so that the inside of the flask was under a nitrogen atmosphere. Next, the flask was maintained at a temperature of 0° C. with ice water. At this temperature, a solution of 10 ml (0.021 mole) of 2.0 mole n-butyl lithium in cyclohexane was slowly dropped into the flask. The mixture was then stirred at room temperature for 2 hours. Again, the flask was maintained at a temperature of 0° C. with ice water, before 20 ml of hexamethylphosphoamide was slowly dropped into the flask. The resulting mixture was then stirred at a temperature of 0° C. for one hour. At a temperature of 0° C., a dilution of 3.9 g (0.021 mole) of 5-bromomethyl-2-norbornene, prepared by a Diels-Alder reaction of cyclopentadiene and bromomethylvinyl, in 10 ml of purified ethylether, was slowly dropped into the inside of the flask. After the resulting mixture was stirred at room temperature for 6 hours, the reaction was terminated.

A salt produced from the reaction was filtered on a glass filter, and the filtered solution was subjected to an extraction with 300 ml of ethyl ether and 200 ml of a saturated ammonium aqueous solution to extract an organic layer. The organic layer was then washed with 200 ml of water twice. The washed organic layer was added with 10 g of anhydrous magnesium sulfate, and then stirred for 12 hours to remove the remaining water. The resulting material was filtered on a glass filter to remove anhydrous magnesium sulfate from the organic layer. After the organic layer was concentrated with an evaporator, it was subjected to the same procedures as those in Example 4, thereby to obtain 3.4 g (28% yield) of t-butyl 3α-(5-norborniene-2-methoxy)-7α, 12α-dihydroxy-5β-cholan-24-oate, as a white solid, represented by the following formula XI.

(XI)

EXAMPLE 8
Preparation of t-butyl 3α-(5-norbornene-2-methoxy)-7α-hydroxy-5β-deoxycholan-24-oate A 500 ml three-necked, round-bottomed flask was charged with 10 g (0.022 mole) of t-butyldeoxycholic acid prepared in Example 2. Then, the same equipment and procedures as those described in Example 7 were used to obtain 3.7 g (30% yield) of t-butyl 3α-(5-norbornene-2-methoxy)-7α-hydroxy-5β-deoxycholan-24-oate, as a white solid, represented by the following formula XII.

(XII)

EXAMPLE 9
Preparation of t-butyl 3α-(5-norbornene-2-methoxy)-5β-lithocholan-24-oate A 500 ml three-necked, round-bottomed flask was charged with 9.5 g (0.022 mole) of t-butyl lithocholic acid prepared in Example 3. Then, using the same equipment and procedures as those described in Example 7 except that the developing solution in the column chromatography was n-hexane/ethyl acetate(3/1, volume ratio), obtained was 4.2 g (34% yield) of t-butyl 3α-(5-norbornene-2-methoxy)-5β-lithocholan-24-oate, as a white solid, represented by the following formula XIII.

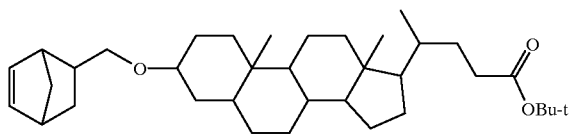

(XIII)

EXAMPLE 10
Preparation of polymer of t-butyl 3α-(5-norbornene-2-carbonyloxy)-7α, 12α-dihydroxy-5β-cholan-24-oate and maleic anhydride 1 g (0.0017 mole) of t-butyl 3α-(5-norbornene-2-carbonyloxy)-7α, 12α-dihydroxy-5β-cholan-24-oate prepared in Example 4, 0.17 g (0.0017 mole) of purified maleic anhydride, and 0.0056 g (2 mole %) of 2,2'-azobisisobutyronitrile as a radical polymerization initiator, were dissolved in 3 ml of toluene solvent. The solution was introduced into a polymerization glass tube ampule which was then sealed under vacuum. Then, the solution was polymerized at a temperature of 65° C. for 20 hours. After the polymerization, the polymerization product was precipitated in petroleum ether/ethyl ether(5/1, volume ratio), and the precipitate was recovered with a glass filter. The recovered material was dried under vacuum at a temperature of 40° C. for 12 hours, thereby obtaining 0.37 g (32% yield) of poly(t-butyl 3α-(5-norbornene-2-carbonyloxy)-7α, 12α-dihydroxy-5β-cholan-24-oate-maleic anhydride), as a white solid.

EXAMPLE 11
Preparation of polymer of t-butyl 3α-(5-norbornene-2-carbonyloxy)-7α-hydroxy-5β-deoxycholan-24-oate with maleic anhydride 1.2 g (0.0021 mole) of t-butyl 3α-(5-norbornene-2-carbonyloxy)-7α-hydroxy-5β-deoxycholan-24-oate prepared in Example 5, 0.2 g (0.0021 mole) of purified maleic anhydride, and 0.0069 g (2 mole %) of 2,2'-azobisisobutyronitrile as a radical polymerization initiator, were dissolved in 3.5 ml of purified toluene solvent. Then, the same procedures as those described in Example 10 were carried out to obtain 0.49 g (35% yield) of poly(t-butyl 3α-(5-norbornene-2-carbonyloxy) -7α-hydroxy-5-deoxycholan-24-oate-maleic anhydride), as a white solid.

EXAMPLE 12
Preparation of polymer of t-butyl 3α-(5-norbornene-2-carbonyloxy) -5β-lithocholan-24-oate, maleic anhydride and 2-hydroxyethyl-5-norbornene-2-carboxylate 0.83 g (0.0015 mole) of t-butyl 3α-(5-norbornene-2-carbonyloxy)-5β-lithocholan-24-oate prepared in Example 6, 0.093 g (0.0005 mole) of 2-hydroxyethyl-5-norbornene-2-carboxylate prepared by a Diels-Alder reaction of cyclopentadiene and 2-hydroxyethyl acrylate, 0.197 g (0.002 mole) of purified maleic anhydride, and 0.005 g (2 mole %) of 2,2'-azobisisobutyronitrile as a radical polymerization initiator, were dissolved in 3 ml of purified toluene solvent. Then, the same procedures as those described in Example 10 were carried out to obtain 0.42 g (38% yield) of poly(t-butyl 3α-(5-norbornene-2-carbonyloxy)-5β-lithocholan-24-oate-2-hydroxyethyl-5-norbornene-2-carboxylate-maleic anhydride, as a white solid.

EXAMPLE 13
Preparation of polymer of t-butyl 3α-(5-norbornene-2-methoxy)-7α,12α-dihydroxy-5β-cholan-24-oate and maleic anhydride 1 g (0.0018 mole) of t-butyl 3α-(5-norbornene-2-methoxy) -7α,12α-dihydroxy-5β-cholan-24-oate prepared in Example 7, 0.18 g (0.0018 mole) of purified maleic anhydride, and 0.0059 g (2 mole %) of 2,2'-azobisisobutyronitrile as a radical polymerization initiator, were dissolved in 3.0 ml of purified toluene solvent. Then, the same procedures as those described in Example 10 were carried out to obtain 0.35 g (30% yield) of poly(t-butyl 3α-(5-norbornene-2-methoxy)-7α,12α-dihydroxy-5β-cholan-24-oate-maleic anhydride, as a white solid.

EXAMPLE 14
Preparation of polymer of t-butyl 3α-(5-norbornene-2-methoxy)-7α-hydroxy-5β-deoxycholan-24-oate and maleic anhydride 1 g (0.0018 mole) of t-butyl 3α-(5-norbornene-2-methoxy)-7α-hydroxy-5β-deoxycholan-24-oate prepared in Example 8, 0.18 g (0.0018 mole) of purified maleic anhydride, and 0.0059 g (2 mole %) of 2,2'-azobisisobutyronitrile as a radical polymerization initiator, were dissolved in 3.0 ml of a purified toluene solvent. Then, the same procedures as those described in Example 10 were carried out to obtain 0.38 g (32% yield) of poly(t-butyl 3α-(5-norbornene-2-methoxy)-7α-hydroxy-5β-deoxycholan-24-oate-maleic anhydride, as a white solid.

EXAMPLE 15
Preparation of polymer of t-butyl 3α-(5-norbornene-2-methoxy)-5β-lithocholan-24-oate, maleic anhydride and 2-hydraxyethyl-5-norbornene-2-carboxylate 0.95 g (0.002 mole) of t-butyl 3α-(5-norbornene-2-methoxy)-5β-lithocholan-24-oate prepared in Example 9, 0.36 g (0.002 mole) of 2-hydroxyethyl-5-norbornene-2-carboxylate prepared by a Diels-Alder reaction of cyclopentadiene and 2-hydroxyethyl acrylate, 0.3 g (0.003 mole) of purified maleic anhydride, and 0.0083 g (2 mole %) of 2,2'-azobisisobutyronitrile as a radical polymerization initiator, were dissolved in 4 ml of purified toluene solvent. Then, the same procedures as those described in Example 10 were carried out to obtain 0.59 g (30% yield) of poly(t-butyl 3α-(5-norbornene-2-methoxy)-5β-lithocholan-24-oate-2-hydroxyethyl-5-norbornene-2-carboxylate-maleic anhydride, as a white solid.

APPLICATION EXAMPLE 1
In a laboratory through which far ultraviolet rays can be passed, 0.2 g of poly(t-butyl 3α-(5-norbornene-2-carbonyloxy)-7α, 12α-dihydroxy-5β-cholan-24-oate-maleic anhydride) prepared in Example 10 and 0.004 g of triphenylsulfoniumtriflate as a photo-acid generator were dissolved in 1.2 g of propyleneglycolmonomethylether acetate. The solution was filtered with a syringe filter to make a photoresist solution. A hexamethyldisilazane solution was dropped and spin-coated at 1,500 rpm, onto a silicon wafer, thereby pretreating the silicon wafer. Then, the prepared photoresist solution was dropped and spin-coated at 2,000 rpm, onto the resulting silicon wafer, to form a 0.42 μm thick thin film.

The silicon wafer was subjected to a prebaking on a hot plate at a temperature of 100° C. for 90 seconds, and patternwise exposed to far ultraviolet rays on a stepper at an exposure dose of 50 mJ/cm². The prebaked wafer was subjected to a postbaking on a hot plate at a temperature of 130° C. for 2 minutes, and then dipped and developed in an aqueous solution containing 2.38 wt % of tetramethylammonium hydroxide for 90 seconds, thereby obtaining a positive resist image of 0.4 μm.

APPLICATION EXAMPLE 2

In a laboratory through which far ultraviolet rays can not be passed, a photoresist solution was prepared with 0.2 g of poly(t-butyl 3α-(5-norbornene-2-carbonyloxy)-7α, 12α-dihydroxy-5β-cholan-24-oate-maleic anhydride) prepared in Example 11, in the same manner as that described in Application Example 1. A silicon wafer was then pretreated with a hexamethyldisilazane in the same manner as that of Application Example 1. The prepared photoresist solution was dropped and spin-coated at 3,000 rpm, onto the pretreated silicon wafer, to form a thin film of 0.35 μm thickness.

The silicon wafer was subjected to a prebaking on a hot plate at a temperature of 100° C. for 90 seconds, and patternwise exposed to far ultraviolet rays on an argon fluoride exciter stepper at an exposure dose of 18 mJ/cm². The prebaked wafer was subjected to a postbaking on a hot plate at a temperature of 130° C. for 2 minutes, and then dipped and developed in an aqueous solution containing 2.38 wt % of tetramethylammonium hydroxide for 40 seconds, thereby obtaining a positive resist image of 0.15 μm.

APPLICATION EXAMPLE 3

In a laboratory through which far ultraviolet rays can not be passed, a photoresist solution was prepared with poly(t-butyl 3α-(5-norbornene-2-carbonyloxy)-7α-hydroxy-5β-deoxycholan-24-oate-maleic anhydride) prepared in Example 11, in the same manner as that described in Application Example 1. A silicon wafer was pretreated with a hexamethyldisilazane in the same manner as that of Application Example 1. The pretreated silicon wafer was subjected to the same spin-coating, prebaking, exposure, and postbaking as those in Application Example 1, and then dipped and developed in an aqueous solution containing 2.38 wt % of tetramethylammonium hydroxide for 90 seconds, thereby obtaining a positive resist image of 0.4 μm.

APPLICATION EXAMPLE 4

In a laboratory through which far ultraviolet rays can not be passed, a photoresist solution was prepared with poly(t-butyl 3α-(5-norbornene-2-carbonyloxy)-5β-lithocholan-24-oate-2-hydroxyethyl-5-norbornene-2-carboxylate-maleic anhydride) prepared in Example 12, in the same manner as that described in Application Example 1. A silicon wafer was pretreated with a hexamethyldisilazane in the same manner as that of Application Example 1. The pretreated silicon wafer was subjected to the same spin-coating, prebaking, exposure, and postbaking as those in Application Example 1, and then dipped and developed in an aqueous solution containing 2.38 wt % of tetramethylammonium hydroxide for 90 seconds, thereby obtaining a positive resist image of 0.4 μm.

APPLICATION EXAMPLE 5

In a laboratory through which far ultraviolet rays can not be passed, a photoresist solution was prepared with poly(t-butyl 3α-(5-norbornene-2-methoxy)-7α, 12α-dihydroxy-5β-cholan-24-oate-maleic anhydride) prepared in Example 13, in the same manner as that described in Application Example 1. A silicon wafer was pretreated with a hexamethyldisilazane in the same manner as that of Application Example 1. The pretreated silicon wafer was subjected to the same spin-coating, prebaking, exposure, and postbaking as those in Application Example 1, and then dipped and developed in an aqueous solution containing 2.38 wt % of tetramethylammonium hydroxide for 90 seconds, thereby obtaining a positive resist image of 0.4 μm.

APPLICATION EXAMPLE 6

In a laboratory through which far ultraviolet rays can not be passed, a photoresist solution was prepared with poly(t-butyl 3α-(5-norbornene-2-methoxy)-7α-hydroxy-5β-deoxycholan-24-oate-maleic anhydride) prepared in Example 14, in the same manner as that described in Application Example 1. A silicon wafer was pretreated with a hexamethyldisilazane in the same manner as that of Application Example 1. The pretreated silicon wafer was subjected to the same spin-coating, prebaking, exposure, and postbaking as those in Application Example 1, and then dipped and developed in an aqueous solution containing 2.38 wt % of tetramethylammonium hydroxide for 90 seconds, thereby obtaining a positive resist image of 0.4 μm.

APPLICATION EXAMPLE 7

In a laboratory through which far ultraviolet rays can not be passed, a photoresist solution was prepared with poly(t-butyl 3α-(5-norbornene-2-methoxy)-5β-lithocholan-24-oate-2-hydroxyethyl-5-norbornene-2-carboxylate-maleic anhydride) prepared in Example 15, in the same manner as that described in Application Example 1. A silicon wafer was pretreated with a hexamethyldisilazane in the same manner as that of Application Example 1. The pretreated silicon wafer was subjected to the same spin-coating, prebaking, exposure, and postbaking as those in Application Example 1, and then dipped and developed in an aqueous solution containing 2.38 wt % of tetramethylammonium hydroxide for 90 seconds, thereby obtaining a positive resist image of 0.4 μm.

As apparent from the above description, the present invention provides the polymer prepared by polymerizing the monomer, in which the derivative of cholic acid, deoxycholic acid or lithocholic acid is bonded to a branched chain of norbornene, copolymerizing the monomer and maleic anhydride, or polymerizing the monomer, maleic anhydride and 2-hydroxyethyl 5-norbornene-2-carboxylate and/or 5-norbornene-2-carboxylic acid. The polymer has much aliphatic rings, and thus is excellent in dry etch resistance. Moreover, the polymer can be prepared with relatively cheap raw materials using a simple method, it is thus cheap in its price. Additionally, from the lithographic evaluation, the polymer reveals that it is excellent in film formation capability and has the ability to form a pattern of a high resolution of 1 μm or less, thereby being an excellent photoresist.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A monomer of the following formula I having a derivative of cholic acid, deoxycholic acid, or lithocholic acid bonded to norbornene:

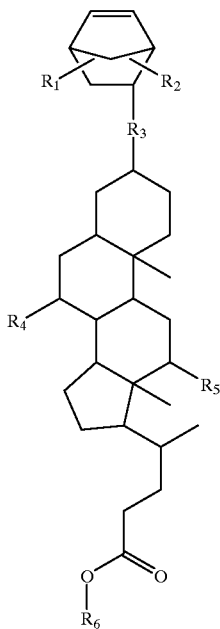

(I)

where $R_1$ and $R_2$ each represent H, $CH_3$, OH, $CH_2OH$, $CO_2CH_3$, or $CO_2C(CH_3)_3$, with which norbornene is substituted, $R_3$ represents $(CH_2)_nO$ (n=0 to 3), $CO(CH_2)_nO$ (n=0 to 3), or $COO(CH_2)_nO$ (n=0 to 3), $R_4$ and $R_5$ each represent H, OH, $OCOCH_3$, $OCO(CH_2O)_nCH_3$ (n=1 to 10), $OCO(CH_2CH_2O)_nCH_3$ (n=1 to 7), or $OCOO(CH_2CH_2O)_n CH_3$ (n=1 to 7), $R_6$ represents H, $C(CH_3)_3$, $CH(CH_3)O(CH_2)_n CH_3$ (n=1 to 3), or a tetrahydropyranyl protecting group.

2. A polymer of the following formula XIV prepared by homopolymerizing the monomer of the formula I in claim 1, the monomer of the formula having a derivative of cholic acid, deoxycholic acid or lithocholic acid bonded to norbornene:

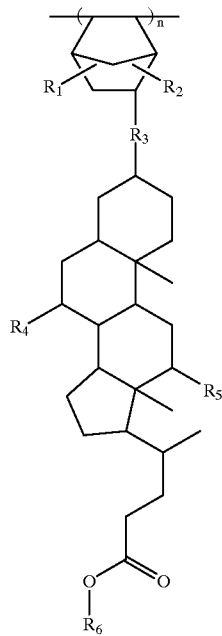

(XIV)

where $R_1$, $R_2$, $R_3$, $R_4$, $R_5$, and $R_6$ have the same meaning as defined in claim 1, and n represents a polymerization degree ranging from 1 to 100.

3. A polymer of the following formula II prepared by copolymerizing the monomer of the formula I in claim 1 with maleic anhydride, the monomer of the formula I having a derivative of cholic acid, deoxycholic acid or lithocholic acid bonded to norbornene:

(II)

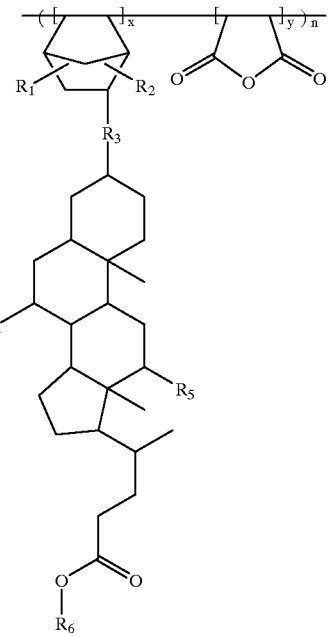

where $R_1$, $R_2$, $R_3$, $R_4$, $R_5$, $R_6$, and n have the same meaning as defined in claim 2, and x=y=0.5.

4. A polymer of the following formula III prepared by copolymerizing the monomer of the formula I in claim 1, 2-hydroxyethyl 5-norbornene and maleic anhydride, the monomer of the formula I having a derivative of cholic acid, deoxycholic acid or lithocholic acid bonded to norbornene:

(III)

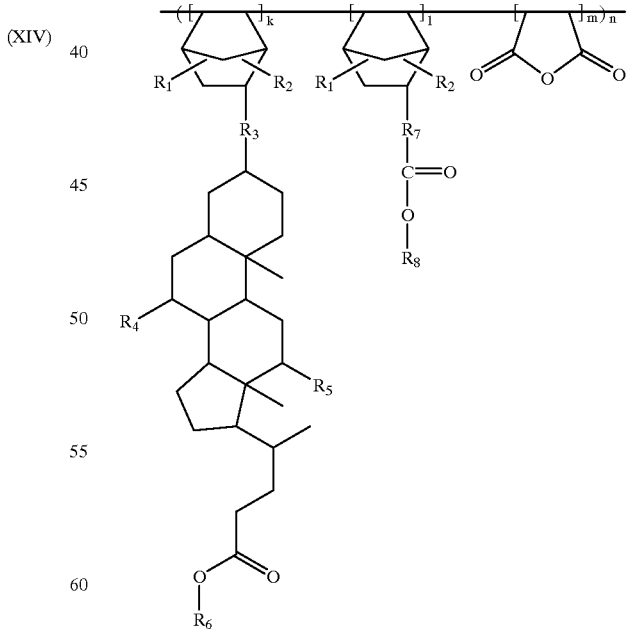

where $R_1$, $R_2$, $R_3$, $R_4$, $R_5$, $R_6$, and n have the same meaning as defined in claim 2, $R_7$ represents $(CH_2)_n$ (n=0 to 3), $CO(CH_2)_n$ (n=0 to 3), or $COO(CH_2)_n$ (n=1 to 3), $R_6$ represents H, $C(CH_3)_3$, $CH(CH_3)O(CH_2)_nCH_3$ (n=1 to 3), a tetrahydropyranyl protecting group, $(CH_2)_n$ (n=1 to 3)OH, or $(CH_2)_n$(n=1 to 3)$OCO(CH_2)_n$(n=0 to 3)$CH_3$, and k+l=m= 0.5.

5. A polymer of the following formula IV prepared by copolymerizing the monomer of the formula I in claim 1, 2-hydroxyethyl 5-norbornene-2-carboxylate, 5-norbornene-2-carboxylic acid and maleic anhydride, the monomer of the formula I having a derivative of cholic acid, deoxycholic acid or lithocholic acid bonded to norbornene:

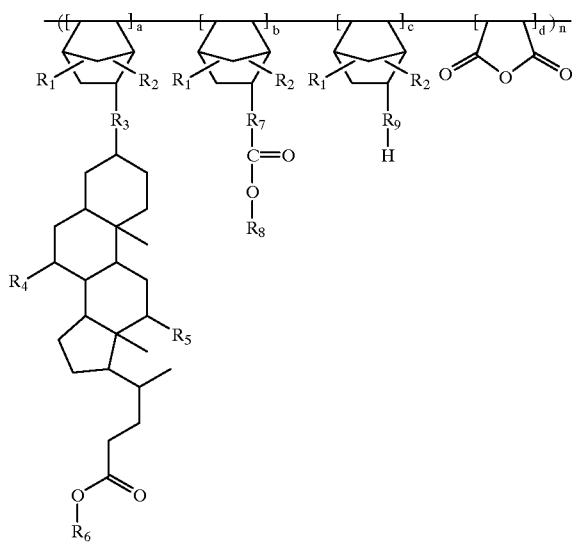

(IV)

where $R_1$, $R_2$, $R_3$, $R_4$, $R_5$, $R_6$, $R_7$, $R_8$, $R_7$, $R_8$ and n have the same meaning as defined in claim 4, $R_9$ represents $(CH_2)_nO$(n=0 to 3), $CO(CH_2)_nO$(n=1 to 3), or $COO(CH_2)_nO$(n=1 to 3), and a+b+c=d=0.5.

6. A method of forming a photoresist solution comprising: dissolving the polymer according to any of claims 2 to 5 in a solvent selected from the group consisting of propylene glycol monomethyl ether acetate, cyclohexanone and dimethylether; adding a triphenylsulfonium triflate or an onium salt photoacid generator to the dissolved polymer forming a photoresist solution; filtering said photoresist solution.

7. A photoresist solution comprising the polymer according to any of claims 2 to 5, a solvent selected from the group consisting of propylene glycol monomethyl ether acetate, cyclohexanone and dimethylether, and a triphenylsulfonium triflate or an onium salt photoacid generator.

* * * * *